United States Patent [19]
Robison et al.

[11] Patent Number: 5,402,499
[45] Date of Patent: Mar. 28, 1995

[54] MULTIMEDIA CONTROLLER

[75] Inventors: Jerel D. Robison, Sunnyvale; David D. Miller, Oakland; Arthur Scott, Menlo Park; Yen C. Chang, Saratoga; Edward X. Wang, San Jose, all of Calif.

[73] Assignee: LSI Logic Corporation, Milpitas, Calif.

[21] Appl. No.: 927,100

[22] Filed: Aug. 7, 1992

[51] Int. Cl.⁶ .............................................. H04B 1/00
[52] U.S. Cl. .................................................. 381/119
[58] Field of Search ................... 381/81, 80, 119, 120, 381/123, 28, 1

[56] References Cited

U.S. PATENT DOCUMENTS

| | | | |
|---|---|---|---|
| 4,292,467 | 9/1981 | Odlen et al. | 381/1 |
| 4,845,756 | 7/1989 | Seen et al. | 381/81 |
| 4,885,792 | 12/1989 | Christensen | 381/119 |
| 4,993,073 | 2/1991 | Sparkes | 381/119 |

FOREIGN PATENT DOCUMENTS 3906734 9/1990 Germany ........................... 381/119

OTHER PUBLICATIONS

"Digital Audio Mixer," *ELEKTOR*, Jul./Aug. 1978, vol. 4, No. 7-8.

Chamberlin, Hal, Muscial Applications of Microprocessors, Hayden Book Co., 1980.

*Primary Examiner*—Curtis Kuntz
*Assistant Examiner*—Mark D. Kelly
*Attorney, Agent, or Firm*—Poms, Smith, Lande & Rose

[57] ABSTRACT

A multimedia controller apparatus provides for computer programmed volume control and summing of audio signals in an enhanced multimedia environment. The apparatus is capable of receiving and processing inputs from a CD-ROM FM synthesizer, general MIDI audio, microphone, PCM sampled sound, and telephony systems. From these inputs, it produces outputs for PCM sampled sound, telephony systems, and stereo line-out. Additionally, it provides for the integration of telephonic support functions into a multimedia system. The multimedia controller apparatus comprises a volume control portion for receiving and controlling the volume of a plurality of analog input signals. The volume controlled input signals are then combined by an aggregation portion. A telephony processing portion is also provided for processing the telephony input signals. Stereo outputs, mono outputs, digital samplable outputs, and telephony outputs can be formed from the combined analog and telephony signals by an output portion. To control the volume control portion, the processing portion, and the output portion, a data control portion is provided which responds to externally generated control data.

5 Claims, 8 Drawing Sheets

FIG. 4

| INDEX REGISTER VALUE | DATA REGISTER | REGISTER FUNCTION |
|---|---|---|
| 00H (00000000) | D0 | ATTENUATION |
| 01H (00000001) | D1 | ATTENUATION |
| 02H (00000010) | D2 | ATTENUATION |
| . . . | . . . | . . . |
| 17H (00010111) | D23 | ATTENUATION |
|  |  |  |
| 40H (01000000) | D64 | PCM PLAYBACK FILTER FREQUENCY |
| 41H (01000001) | D65 | PCM RECORD FILTER FREQUENCY |
| 42H (01000010) | D66 | LEFT CHANNEL SOURCE SELECTION |
| 43H (01000011) | D67 | RIGHT CHANNEL SOURCE SELECTION |
| 44H (01000100) | D68 | TELEPHONY OUTPUT SOURCE SELECTION |
|  |  |  |
| 80H (10000000) | D128 | CALLER ID CONFIGURATION AND STATUS |
| . . . | . . . | . . . |
| A0H (10100000) | D160 | DTMF RECEIVER CONFIGURATION AND STATUS |
| . . . | . . . | . . . |

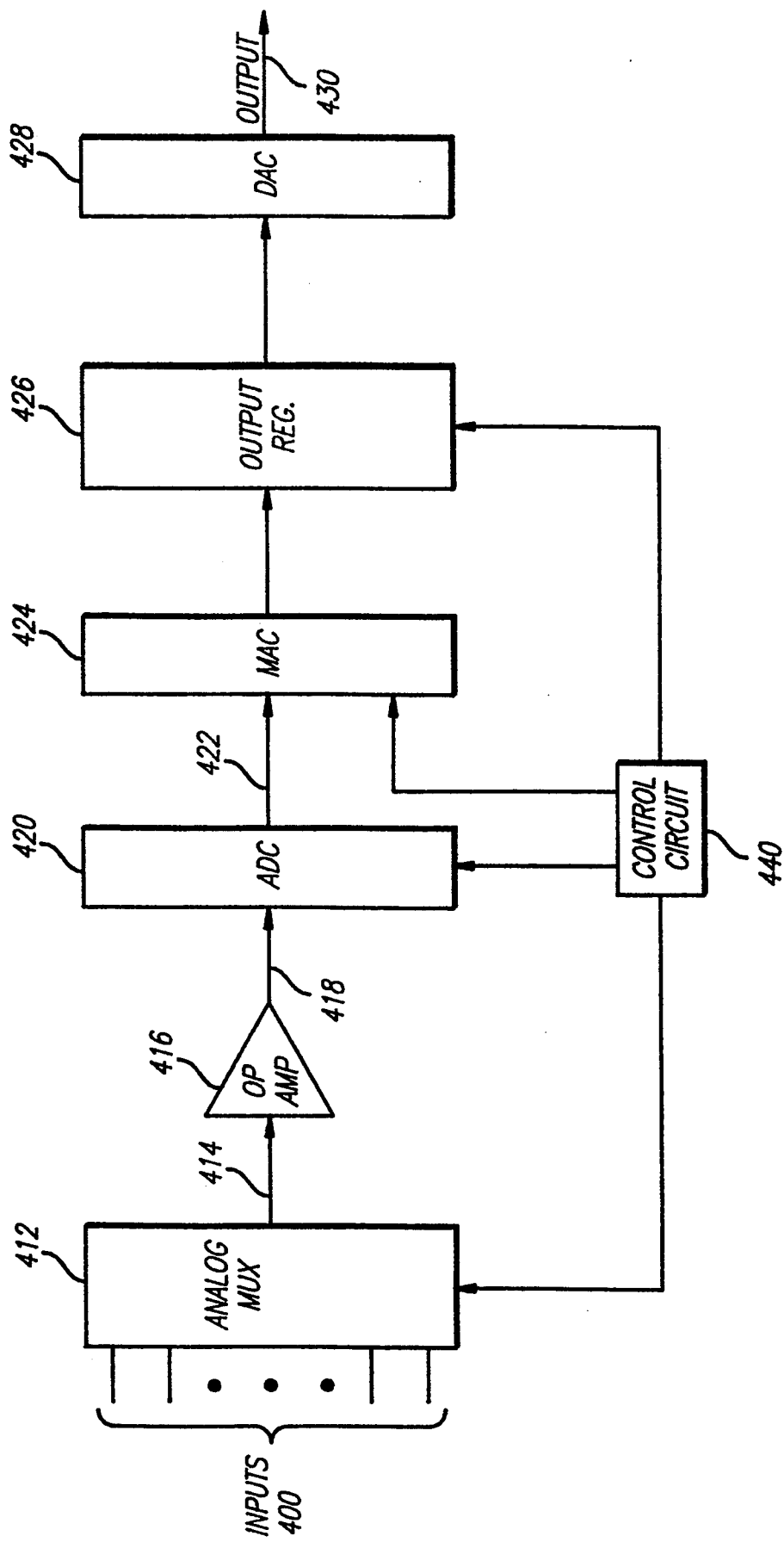

MULTIMEDIA CONTROLLER

INTRODUCTION

Generally stated, the present invention relates to the control of audio signals, and more particularly to a computer integrated multimedia controller for summing and controlling a variety of audio frequency sources.

BACKGROUND OF THE INVENTION

The evolution of computer technology has created a need for computer systems that can also process various audio and/or informational inputs. The use of computers to process audio signals has become known in the art as a "multimedia" PC or a "multimedia environment." In a multimedia environment, audio signals from various input sources are typically summed and communicated to common output devices. Discrete analog components are typically utilized which provide for controlling the relative volumes of the input signals, summing the input signals together, processing telephony signals and information, and outputting the aggregate signals in the desired format.

The use of discrete components to control audio and/or other informational signals has significant drawbacks. Many new multimedia applications require lower component cost, higher utilization of circuit board space and higher reliability. In addition, the use of discrete components often loses critical functionality and flexibility. Moreover, several types of audio signals either originate with or are controlled via a computer network. Discrete analog components can not be easily interfaced with computers to produce consistent and high quality results.

Therefore, a critical need exists for a system that would provide computer programmed volume and summing control, along with information processing in a compact fashion. A need also exists for a system capable of receiving and processing inputs from telephony systems, CD-ROM (compact disk-read only memory) analog storage devices, line-in sources (such as from audio tape), FM (frequency modulation) synthesizers, microphones, and PCM (pulse code modulation) sampled sounds, and which can combine each of these inputs in a desired way. A need also exists for a system capable of providing outputs for PCM sampled sound, telephony systems, and stereo line-out, so that the outputs can be put to use in the multimedia environment. Due to extensive use of computers, a need also exists for a system that can be digitally controlled through an external computer network under register control. The present invention fulfills each of these needs.

SUMMARY OF THE INVENTION

It is therefore a primary object of the present invention to provide a system allowing for computer programmed volume control and summing of audio signals in order to provide an enhanced multimedia environment.

It is a further object of the present invention to provide a system capable of receiving and processing inputs from a CD-ROM memory storage device, an FM synthesizer, general MIDI (musical instrument data interface, a standardized format for computer generated audio signals) audio, microphones, PCM sampled sound, and telephony systems.

Another object of the present invention is to provide a system capable of producing outputs for PCM sampled sound, telephony systems, and stereo line-out.

Another object of the present invention is to provide for the integration of telephonic support functions into a multimedia system.

Yet another object is to provide a system capable of being controlled through an external computer network.

The present invention achieves these and other objects. Generally, the present invention comprises a computer integrated audio signal controller with additional support for telephony functions. The system receives and provides control of the volume of a variety of audio inputs, sums selected ones of the inputs, and produces a variety of audio outputs, all under register control. The system also generates samplable output signals in a format which can be readily input into an analog-to-digital converter. The system also receives and decodes telephonic signals such as voice, dual tone multi-frequency (DTMF) and caller ID and sends telephonic audio signals. The system also provides support for additional telephonic processing devices to access a telephone network and multimedia environment.

More specifically, the multimedia controller apparatus of the present invention first comprises an attenuation portion for controlling the relative volume level of a plurality of analog input signals. The attenuation portion further comprises a plurality of left channel input attenuators each receiving individual left channel input signals, a plurality of right channel input attenuators each receiving individual right channel input signals, and a plurality of mono input attenuators each receiving individual mono input signals. Each of the attenuators selectively control the volume of respective ones of the input signals.

Next, the multimedia controller comprises an aggregation portion for aggregating the attenuated input signals. The aggregation portion further comprises a left channel summing circuit combining the left channel volume controlled input signals into a combined left channel signal, a right channel summing circuit combining the right channel volume controlled input signals into a right channel combined signal, and a mono summing circuit combining the mono volume controlled input signals into a mono combined signal.

The multimedia controller also comprises an output portion for producing stereo outputs, digital samplable outputs and telephony outputs. The output portion further comprise a left channel output circuit receiving the left channel combined signal and producing a left channel output signal, a right channel output circuit receiving the right channel combined signal and producing a right channel output signal, and a mono channel output circuit receiving the mono combined signal and producing a mono output signal.

To control the function of the apparatus, the multimedia controller comprises a data control portion for controlling the attenuators, the summing circuits, and the output circuits in response to externally generated control data. Finally, the multimedia controller comprises a telephony processing portion for processing telephonic format information.

In another embodiment of the present invention, the multimedia controller apparatus comprises a digital circuit for digitally volume controlling and summing a plurality of analog input signals. More specifically, the digital circuit comprises a time multiplexed gate to sequentially permit passage of discrete segments of each of the input signals, an analog-to-digital converter to convert the discrete segments to a sequence of binary or digital outputs, and a multiplier/accumulator to multiply each of the binary outputs by a number corresponding with a desired degree of attenuation and to sum the multiplied binary outputs. A digital-to-analog converter converts the sum back to an analog format, and a control circuit is provided to maintain the synchronization of the gate, the analog-to-digital converter, the multiplier/accumulator and the digital-to-analog converter.

Alternatively, the digital circuit comprises a time multiplexed gate to sequentially permit passage of discrete segments of each of the input signals, an analog-to-digital converter to convert the discrete segments to a sequence of binary outputs, and a multiplier to multiply each of the binary outputs by a number corresponding with a desired degree of attenuation. Both a left channel output register and a right channel output register are provided to alternatingly receive and temporarily store the multiplied binary output. A left channel digital-to-analog converter converts the stored left channel multiplied binary output to a left channel analog signal, and a right channel digital-to-analog converter converts the stored right channel multiplied binary output to a right channel analog signal. A control circuit is also provided for maintaining synchronization of the gate, the analog-to-digital converter, the multiplier, the registers, and the digital-to-analog converters.

In this alternative embodiment, the signals from the various channels are not summed digitally prior to the conversion to analog signals, but each level controlled signal is individually converted to analog form and supplied to the output circuit. The successive signals from different channels are supplied at so high a rate (more than twice the highest desired audio frequency for each channel) that the output circuit including the speaker or other acoustic transducers produces an output which sounds to the listener as a summed signal. Thus, the summing function is performed external from the multimedia controller.

A more complete understanding of the multimedia controller apparatus of the present invention will be afforded to those skilled in the art, as well as a realization of additional advantages and objects thereof, by a consideration of the following detailed description of a preferred exemplary embodiment. Reference will be made to the appended sheets of drawings which will be first described briefly.

DESCRIPTION OF THE DRAWINGS

FIG. 4 shows a table which maps the status and configuration registers to the index register;

FIG. 5 shows a block diagram of a first alternative embodiment of an audio summing circuit.

DETAILED DESCRIPTION OF A PREFERRED EXEMPLARY EMBODIMENT

In the following description, for purposes of explanation, numerous details are set forth such as specific memory sizes, data paths, word sizes, bit designations, data path widths, circuit components, etc., in order to provide a more thorough understanding of the present invention. However, it will be apparent to one skilled in the art, and it is fully intended herein, that these specific details are not required in order to practice the present invention. In other instances, well known electrical structures and circuits are shown in block diagram form in order not to obscure the present invention unnecessarily. It is specifically noted that a variety of control circuits exist between a register set within the apparatus and various circuit functions within the apparatus, but that in one or more of the block diagrams they are left out for the purposes of clarifying the analog signal paths. It is understood that these control circuits are required to realize the invention.

The evolution and use of computer systems has created a need for multimedia audio controllers. Signals originating from CD-ROM, telephony, general MIDI audio, PCM sampled sound, FM synthesizers, microphone and line-in auxiliary audio signals and/or combinations of these signal sources are increasingly used in the multimedia environment in conjunction with software driven applications.

Figure 1:
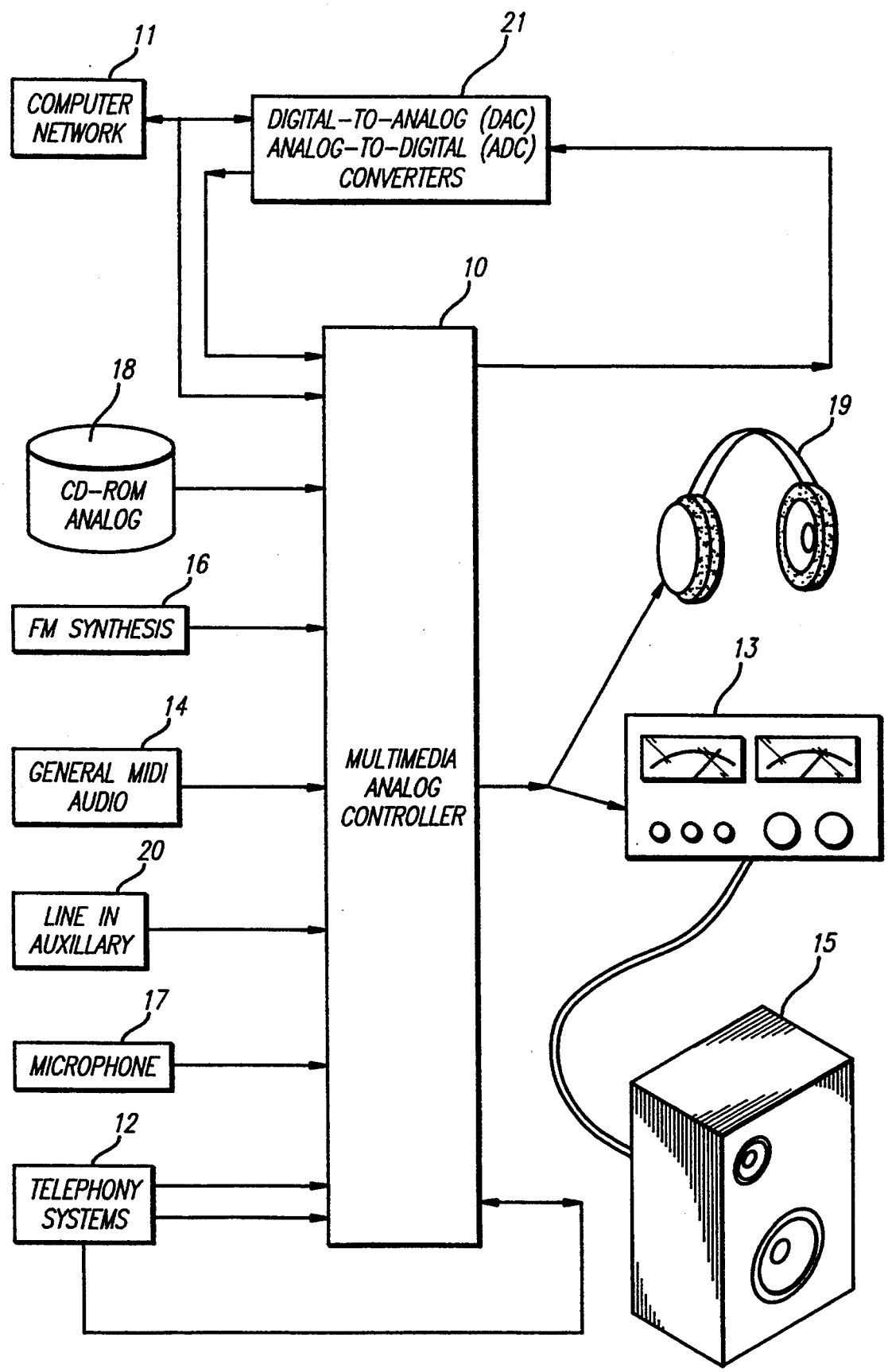
FIG. 1 illustrates a multimedia analog controller connected to a variety of audio and telephony inputs and producing a variety of audio, samplable and telephony outputs.

Referring first to FIG. 1, there is shown an exemplary multimedia analog controller 10 which receives a plurality of audio input signals and produces a plurality of audio outputs. The multimedia analog controller 10 interfaces with an assortment of external devices. Exemplary input signals from telephonic systems 12, general MIDI audio systems 14, line-in from auxiliary source 20, microphone source 17, FM synthesizer source 16, CD-ROM analog source 18, and digital-to-analog converted source 21 are received and processed. It will be appreciated that other input devices may also be employed. Also shown in FIG. 1 are exemplary amplifiers and speakers 13, telephonic systems 12, headphones 19 and analog-to-digital receptors 21 which receive outputs generated by the multimedia controller 10. A digital computer network 11 is also shown, which sends digital data signals to the inputs of a digital-to-analog or analog-to-digital (DAC/ADC) converter 21, and receives digital data signals from the DAC/ADC convertor 21. As will be further described below, the analog controller 10 is operated from the external computer network 11, which instructs the controller 10 to format the input signals into a desired output format. The controller 10 processes the input signals by attenuating each signal to a desired level and then sending that signal along with other attenuated signals to produce a resultant signal or a plurality of resultant signals. In this way, desired signals for use in recording, broadcasting, telephony, etc., are derived.

Figure 2A:
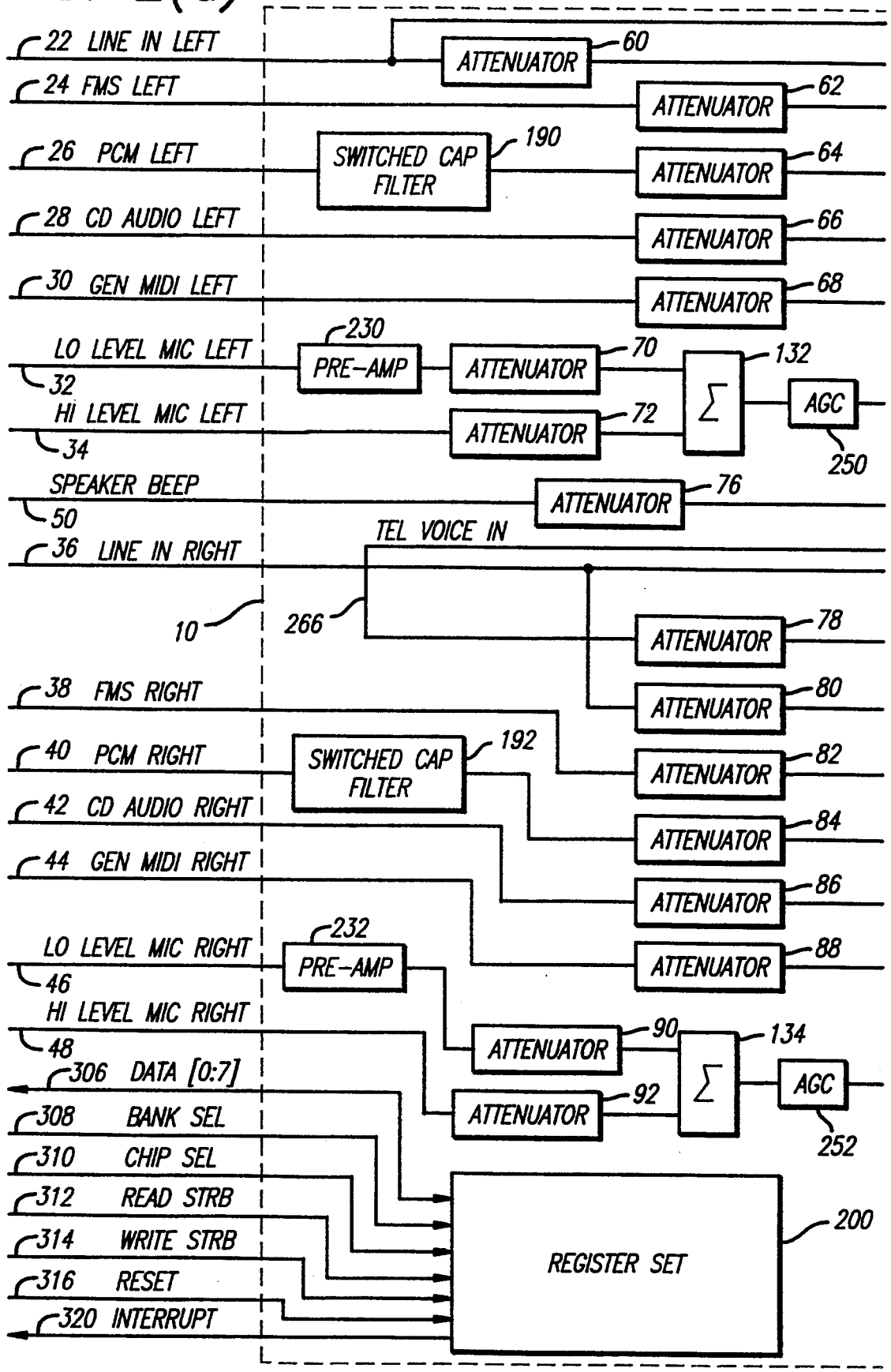
FIG. 2 shows a block diagram of the multimedia analog controller apparatus.
Figure 2B:
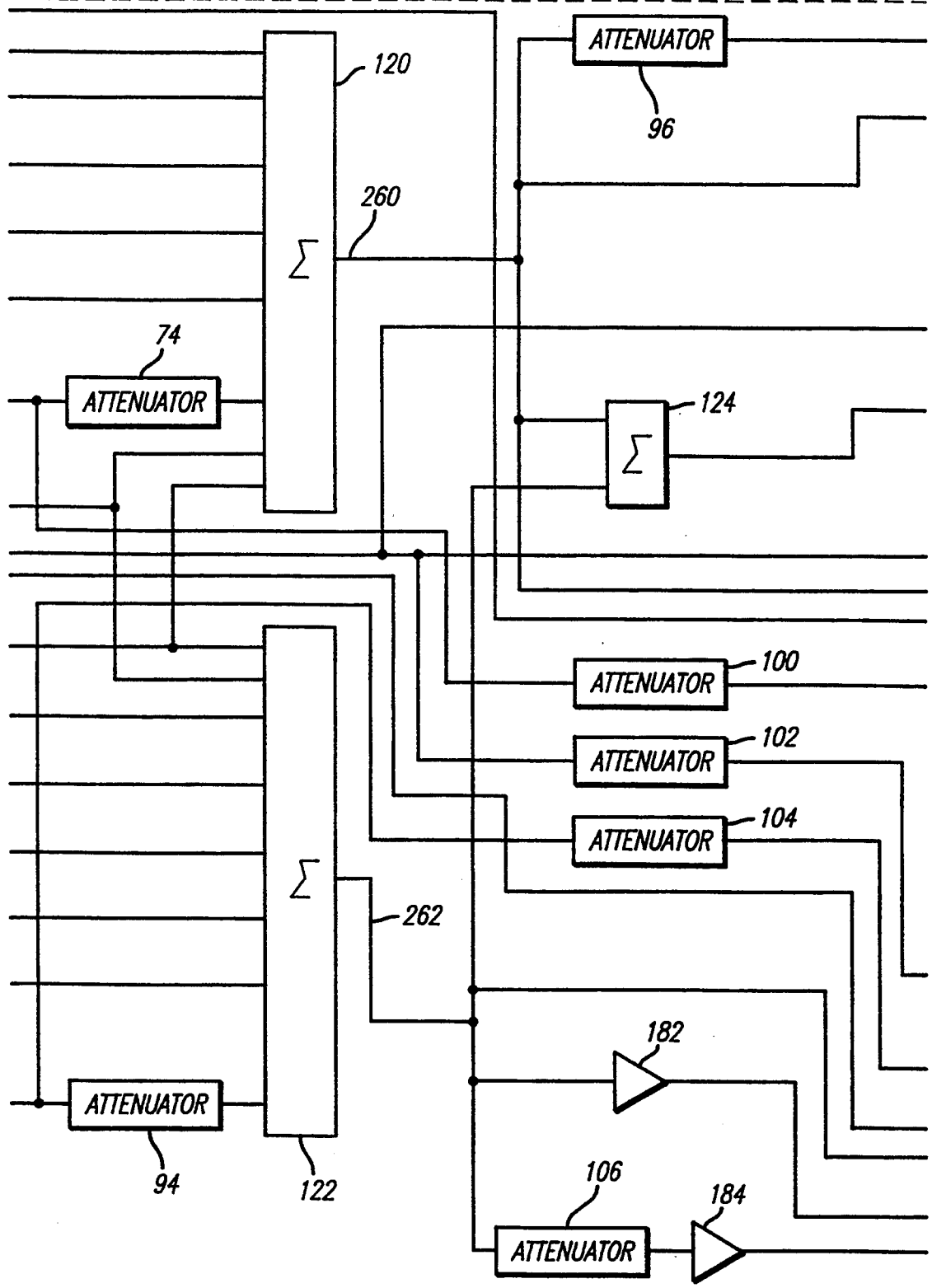
Figure 2C:
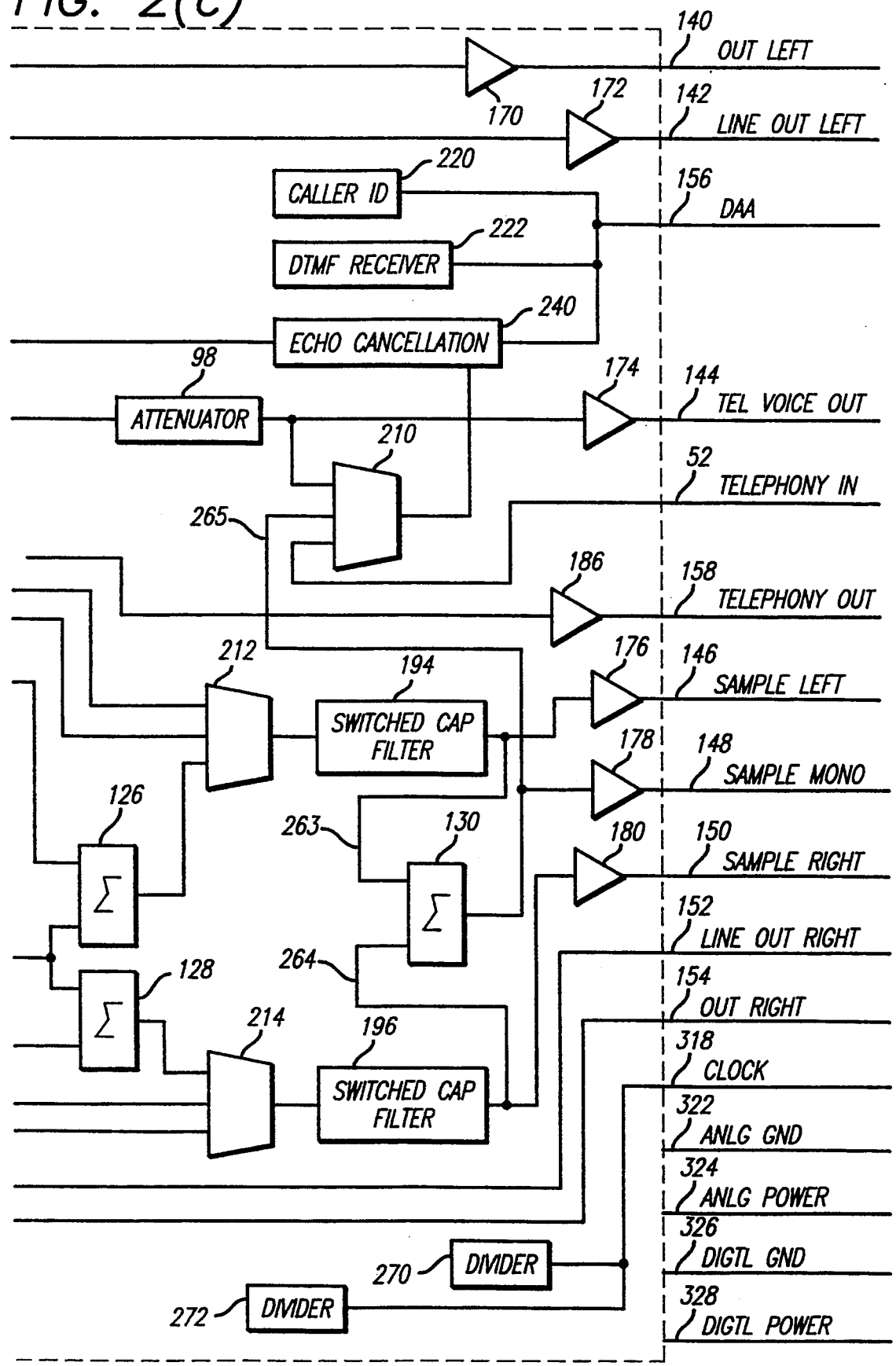

A more detailed block diagram of the internal components of the multimedia analog controller 10 apparatus is shown in FIG. 2. The multimedia controller 10 receives a plurality of analog audio input signals. The audio inputs include left channel audio input signals 22, 24, 26, 28, 30, 32 and 34. The audio inputs also include right channel audio input signals 36, 38, 40, 42, 44, 46 and 48. The audio inputs also include the input for speaker beep signal 50, and the input for the telephony signal 52.

The multimedia controller 10 also includes attenuator circuits which provide amplitude or volume control of the audio input signals and some of the output signals, and can allow all, none or an intermediate portion of the input signals to pass through the device to the next stage in the circuit. The attenuator circuits include attenuators 60, 62, 64, 66, 68, 70, 72, 74, 76, 78, 80, 82, 84, 86, 88, 90, 92, 94, 96, 98, 100, 102, 104, and 106. As will be described below, each attenuator circuit corresponds to an individual audio input signal.

More specifically, the left channel input portion of the multimedia controller 10 comprises: 1) a first left channel attenuator 60 to receive a first left channel analog input signal 22 from an external auxiliary analog source, such as from a tape recorder or radio; 2) a second left channel attenuator 62 to receive a second left channel analog input signal 24 from an external source, such as from a digital-to-analog converter (DAC) embodied in an FM synthesizer device; 3) a third left channel attenuator 64 to receive a third left channel analog signal at the output of a switched capacitor filter 190; 4) a fourth left channel attenuator 66 to receive a fourth left channel analog input signal 28, such as from a CD-ROM audio source; 5) a fifth left channel attenuator 68 to receive a fifth left channel analog input signal 30, such as from a general MIDI analog source; and 6) a sixth left channel attenuator 74 to receive a sixth left channel analog signal from the output of an automatic gain control circuit 250.

The left channel input portion also comprises several signal processing circuits. The switched capacitor filter circuit 190 is provided to receive an external analog input signal 26, such as a decoded analog Pulse Code Modulated (PCM) signal from a DAC embodied in an external digital-to-analog network. As known in the art, the switched capacitor filter circuit 190 is a low pass filter which provides waveform smoothing of the DAC generated input signal 26. The frequency characteristics of the filter 190 are controlled by the state of the register set 200, as will be further described below.

The signal provided to the attenuator 74 originates from both a low level microphone signal 32 and a high level microphone signal 34. The low level microphone signal 32, such as generated by a standard microphone, feeds into a microphone pre-amplifier 230. As will be appreciated, microphone signals are generally at a much lower power level than other audio input types, so that pre-amplifier 230 is necessary to bring the low level microphone signal 32 to the same level as the other left channel input signals described above. The pre-amplified microphone signal is then provided to an attenuator 70. The high level microphone signal 34 does not require pre-amplification since it is already at a line level, and is provided to an attenuator 72. A summing circuit 132 receives both the analog signal outputs from the attenuator 70 and the attenuator 72, aggregates the signals, and applies the aggregated signal to the input of the automatic gain control circuit 250. These circuits enable either the low level microphone signal 32, the high level microphone signal 34, or both signals to be further processed through the multimedia controller 10.

Similarly, the right channel input portion comprises: 1) a first right channel attenuator 80 to receive a first right channel analog input signal 36 from an external auxiliary analog source, such as from a tape recorder or radio; 2) a second right channel attenuator 82 to receive a second right channel analog input signal 38 from an external source, such as a decoded analog Pulse Code Modulated (PCM) signal from a DAC embodied in an FM synthesizer device; 3) a third right channel attenuator 84 to receive an analog input signal from a switched capacitor filter 192; 4) a fourth right channel attenuator 86 to receive a fourth right channel analog input signal 42, such as from a CD-ROM audio source; 5) a fifth right channel attenuator 88 to receive a fifth right channel analog input signal 44, such as from a general MIDI analog source; 6) a sixth right channel attenuator 94 to receive a right channel analog signal from the output of an automatic gain control circuit 252.

As described above with reference to the left channel input portion, the right channel input portion comprises similar signal processing circuits. The switched capacitor filter circuit 192 is provided to receive an external analog input signal 40, such as from a DAC embodied in an external digital-to-analog network. As with filter 190, the switched capacitor filter circuit 192 is a low pass filter which provides waveform smoothing of the DAC generated input signal 40. The frequency characteristics of the filter 192 are controlled by the state of the register set 200, as will be further described below.

As in the left channel, the signal provided to the attenuator 94 originates from both a low level microphone signal 46 and a high level microphone signal 48. The low level microphone signal 46, such as generated by a standard microphone, feeds into a microphone pre-amplifier 232. The pre-amplifier 232 is necessary to bring the low level microphone signal 46 to the same level as the other right channel input signals. The pre-amplified microphone signal is then provided to an attenuator 90. The high level microphone signal 48 does not require pre-amplification since it is already at a line level, and is provided to an attenuator 92. A summing circuit 134 receives both the analog signal outputs from the attenuator 90 and the attenuator 92, aggregates the signals, and applies the aggregated signal to the input of the automatic gain control circuit 252. These circuits enable either the low level microphone signal 46, the high level microphone signal 48, or both signals to be further processed through the multimedia controller 10.

In addition to the left channel input portion and the right channel input portion, a mono input portion exists for inputting signals which are inherently monophonic into the summing circuits 120 and 122. A first monophonic analog input signal 50, such as from a speaker beep source emanating from an external computer network 11 or telephony system 12, is provided to an attenuator 76. The output of the attenuator 76 is applied to both the left channel summing circuit 120 and the right channel summing circuit 122. A second monophonic input signal 266, also known as telephone voice-in from an echo cancellation circuit 240 (described below), is provided to an attenuator 78. The output of the attenuator 78 is simultaneously applied to both the left channel summing circuit 120 and the right channel summing circuit 122. As will be appreciated, this signal path allows voice communication to be extracted from the telephone system 12 and introduced into the multimedia system for the purposes of sampling or immediate presentation to headphones 19.

Next, the multimedia controller 10 has an aggregation portion which sums the attenuated input signals. The aggregation circuits include the left output channel summing circuit 120, the right output channel summing circuit 122, a telephone voice-out summing circuit 124, a left sample summing circuit 126, a right sample summing circuit 128, and a mono sample summing circuit 130. Each of the summing circuits combine the respective attenuated inputs to produce a single output signal which represents the analog sum of the input signals. The additional summing circuits 132 and 134 (described above) are provided to allow for the use of various microphone source signal levels.

The left channel summing circuit 120 aggregates the processed signals from the first left input channel attenuator 60, the second left input channel attenuator 62, the third left input channel attenuator 64, the fourth left input channel attenuator 66, the fifth left input channel attenuator 68, the sixth left input channel attenuator 74, the first monophonic input channel attenuator 76, and the second monophonic input channel attenuator 78. From these left channel and monophonic inputs, the left channel summing circuit 120 produces a single left channel analog signal 260.

Likewise, the right channel summing circuit 122 aggregates the processed signals from the first right input channel attenuator 80, the second right input channel attenuator 82, the third right input channel attenuator 84, the fourth right input channel attenuator 86, the fifth right input channel attenuator 88, the sixth right input channel attenuator 94, the first monophonic input channel attenuator 76, and the second monophonic input channel attenuator 78. From these right channel and monophonic inputs, the right channel summing circuit 122 produces a single right channel analog signal 262.

Next, the aggregated left and right channel signals are distributed to various output portions of the multimedia controller 10. The left channel analog signal 260 passes through an attenuator 96 and a buffer 170 to produce an attenuateable left channel output 140. The left channel analog signal 260 also passes through a buffer 172 to produce a left channel line output 142. The left channel analog signal 260 is also provided to the summing circuit 124 to be used in the creation of a monophonic analog signal suitable for output into a telephony system 12. Finally, the left channel analog signal 260 is also provided to a multiplexer 212, along with several other sources selectable to be processed into a samplable left output 146, as will be described below.

Similarly, the right channel analog signal 262 passes through an attenuator 106 and a buffer 184 to produce an attenuateable right channel output 154. The right channel analog signal 262 also passes through a buffer 182 to produce a right channel line output 152. The right channel analog signal 262 is also provided to the summing circuit 124, to be used in the creation of a monophonic analog signal suitable for output into a telephony system 12. Finally, the right channel analog signal 262 also passes to a multiplexer 214, along with several other sources selectable to be processed into the samplable left output 150, as will be described below.

The multimedia controller 10 can also produce a left, right and mono channel signal in a format acceptable for sampling by an external analog-to-digital converter (ADC). Such an output signal could be input into an external computer network 11. The left channel samplable signal is formed from the left channel analog signal 260, the first left channel input 22, and an aggregate signal provided by a summing circuit 126. The volume of the telephone voice-in signal from the echo cancellation circuit 240 is controlled by an attenuator 102. The volume of the output of the automatic gain control circuit 250 is controlled by an attenuator 100. The summing circuit 126 combines the outputs of the attenuators 100 and 102. In this way, the summing circuit 126 can produce an output signal that contains all, none or an intermediate portion of the left channel microphone input along with all, none or an intermediate portion of the telephone voice-in signal received from the external telephony network 12.

Each of the left channel analog signal 260, the first left channel input 22 and the output of summing circuit 126 are provided to a multiplexer 212. The multiplexer 212 passes a selected one of these signals to a switched capacitor filter 194, according to the state of the register set 200, as will be described below.

Similarly, an analog multiplexer 214 receives the right channel analog signal 262, the first right channel input 36 and the analog signal output of a summing circuit 128. The output volume of automatic gain control 252 is controlled by an attenuator 104. The summing circuit 128 receives and combines the outputs of the attenuator 102 and the attenuator 104, to present a signal format to the multiplexer 214 that contains all, none or an intermediate portion of the right channel microphone input along with all, none or an intermediate portion of the telephonic signal received from the DAA signal 156. The multiplexer 214 passes a selected one of these signals to a switched capacitor filter 196, according to the state of the register set 200, as will be described below.

As is known in the art, the energy content of a signal at the Nyquist frequency must be reduced sufficiently to prevent undesirable information from being created in the digital data. A switched capacitor filter 194 is provided to apply anti-alias filtering of the selected left audio signal from multiplexer 212, and produce a left samplable signal 263. Similarly, a switched capacitor filter 196 provides anti-alias filtering to the selected right audio signal from multiplexer 214, and produce a right samplable signal 264. Summing circuit 130 provides for the aggregation of the left samplable signal 263 and the right samplable signal 264 to produce a mono samplable signal 265.

The output section of the analog controller 10 includes buffer circuits for all signals that are strictly outputs only. The buffer circuits include buffers 170, 172, 174, 176, 178, 180, 182, 184 and 186. The left samplable signal 263 is buffered by the buffer circuit 176 to produce a left samplable output 146. The right samplable signal 264 is buffered by the buffer circuit 180 to produce a right samplable output 150. The left samplable signal 263 and the right samplable signal 264 are summed by a summing circuit 130, and the summed signal is passed through the buffer 178 to become a samplable monophonic output 148.

Since sampling by an external ADC requires the left, right and monophonic outputs 146, 150 and 148 to have the proper high frequency roll-off, the left and right channel filters 194 and 196 filters could include the 7th order Butterworth lowpass design, as is well known in the art. Filter clock signals are provided by divider networks 270 and 272, which are controlled by the state of the register set 200, to insure that the cutoff frequency of the filters tracks the ADC sampling rate.

A plurality of telephony signals are received and processed by the multimedia controller 10. The telephony signals include a DAA (Data Access Arrangement) input/output signal 156, a telephone voice output signal 144, a telephony in input signal 52 and a telephony out output signal 158. The telephony processing functions include a caller ID function 220, a DTMF (Dual Tone Multi Frequency) receiver function 222, and an echo cancellation function 240. The circuits providing these functions are well known in the art. It is further anticipated that additional telephony processing circuits be provided internal to the analog controller 10 for the purposes of supporting additional desired telephony processing functions.

Specifically, the caller ID circuit 220, the DTMF receiver circuit 222 and the echo cancellation circuit 210 receive an analog signal from a DAA input/output line 156. The DAA input/output line 156 normally connects to an external telephone line interface. As such, the caller ID circuit 220 is able to extract telephone number information from the DAA signal 156, known in the art as the caller ID, embedded in the information format of an incoming telephonic communication stream. The caller ID circuit 220 decodes the caller ID information, and presents the information to the register set 200 to be examined by an external computer network 11.

The DTMF receiver circuit 222 performs a similar function of extracting embedded information from the format of a telephonic communication stream incoming from the DAA signal 156. DTMF is an encoding format for the communication of symbolic information across telephony networks, such as telephone numbers and access codes transmitted and received by telephony equipment. The DTMF circuit 222 decodes the DTMF information extracted from the DAA signal 156 and presents the information to the register set 200 to be examined by an external computer network 11.

The echo cancellation circuit 240 extracts information from a telephonic network and places information onto that network while simultaneously minimizing undesirable feedback. The echo cancellation circuit 240 receives telephonic information from DAA input/output 156 and passes the processed signal to an attenuator 78, the attenuator 102 and the output buffer 186.

Since it is common for the telephonic information to be of a voice format, this voice information can be processed by the multimedia controller 10 so as to be heard through the outputs. The attenuator 78 can control the volume of the voice in signal 266 to allow all, none or an intermediate amount of the signal 266 to pass to summing circuits 120 and 122, which were described above. In this way, an operator of the multimedia controller 10 can listen to the telephone lines. Similarly, the voice in signal 266 is provided to attenuator 102 so that the voice information can be listened to through the samplable outputs 146, 148 and 150. In this way the telephonic information can be sampled by an external computer network 11. It will be appreciated by those skilled in the art that this ability is fundamental to the creation of telephonic systems known as voice mail.

The telephone voice in signal 266 is also provided to output buffer 186 to create the telephony out signal 158. The telephony out 158 can be used by external telephonic functions which have not been integrated into the apparatus. In this way, the multimedia controller 10 provides integrated telephony processing functions as well as supporting external telephony processing functions and devices.

To further support external telephony functions, a multiplexer 210 is provided to select from either a signal containing the aggregation of all input sources, a signal containing only the microphonic and telephonic input sources, or a signal containing the output format from an external telephony processing function such as a fax/modem controller. The multiplexer 210 permits the telephony in input signal 52 from the external telephony processing functions to be provided to the echo cancellation circuit 240, which can ultimately place the signal on the DAA input/output line 156.

Finally, a register set 200 controls the attenuation circuits, the filter circuits, the multiplexer circuits, and the telephony support circuits. The register set 200 receives digital data 306 from an external source, such as computer network 11, and controls the extent of attenuation applied to the input signals, the format of the output signals and the operation of the telephony support circuits. Within the register set 200 are an index register, a plurality of attenuation data registers, a plurality of configuration registers and a plurality of status registers. The attenuation data registers correspond to each attenuator circuit, and control the degree of attenuation applied to each input in response to digital data inputs 306 to the apparatus. The configuration registers define the configuration of multiplexers and the operation of telephony systems functions. The status registers may be interrogated by the external computer network to report the status of the apparatus.

Figure 3:
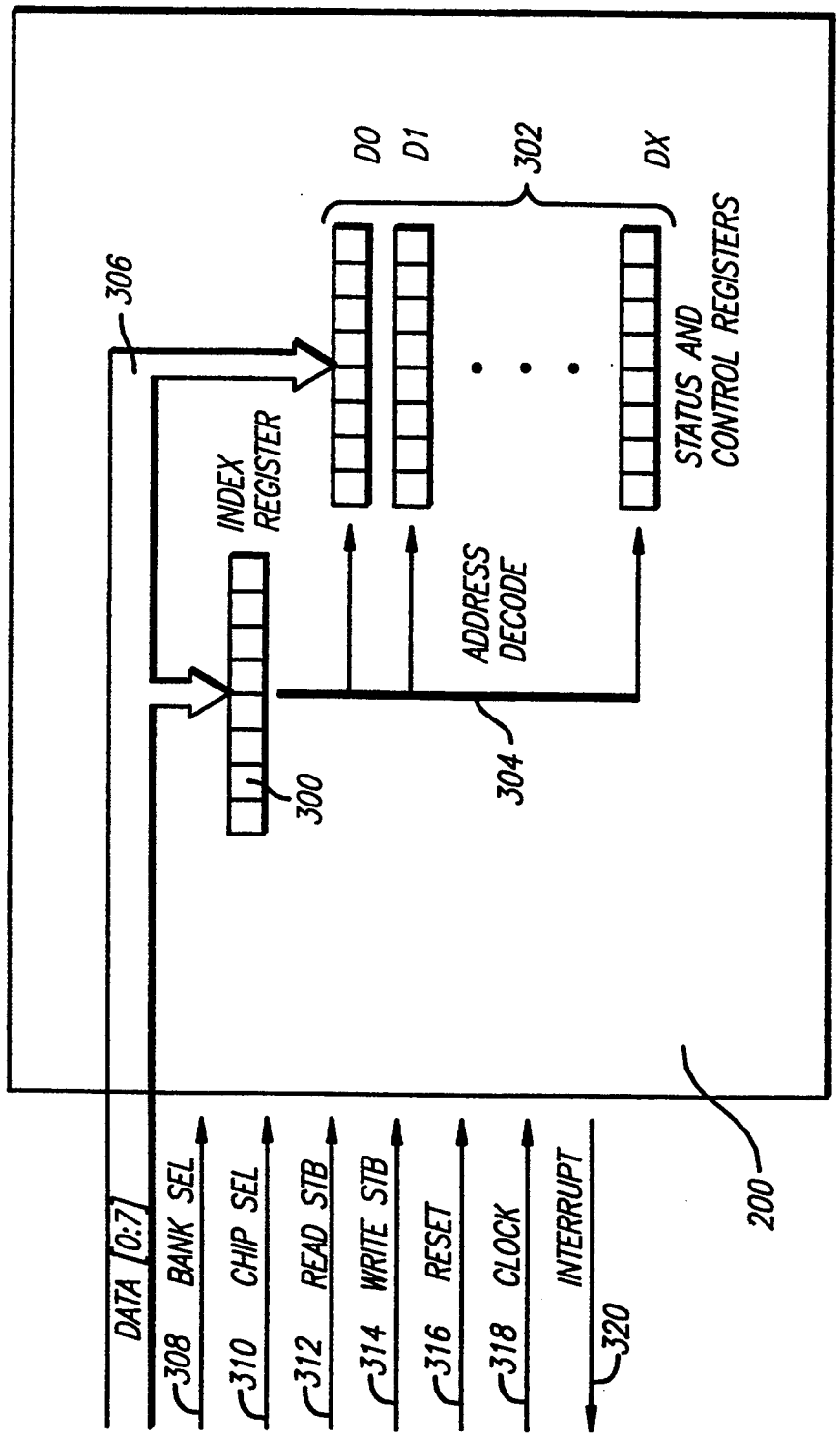
FIG. 3 shows a block diagram of an exemplary register set.

A block diagram of a register set 200 is shown in FIG. 3, comprising the index register 300 and the bank of data registers and status registers 302. The digital input signals include data inputs 306, a bank select input 308, a chip select input 310, a read strobe 312, a write strobe 314, a reset input 316, a clock input 318, and an interrupt output 320. In this preferred embodiment, each of the registers is 8 bits wide. External commands sent to the register set 200 can determine the attenuation level of each input signal and the form of the output. The timing and control of the reading of the data onto the registers within the register set 200 is controlled by the read strobe 312 and the write strobe 314 in conjunction with the chip select strobe 310, which functions as commonly known in the art.

The register set 200 contains two banks of registers. The single register in the first bank is the index register 300. This register is addressed by setting the bank select signal 308 low when accessing the register set 200. The status and control registers 302 used for interrogating and configuring the apparatus reside in the second bank. This second bank of registers is accessed by setting the bank select signal 308 high, or a logic "1". When the bank select signal 308 is set low, or a logic "0", data entering the register set 200 via data inputs 306 is read onto index register 300 in the first register bank. When the bank select signal 308 is high, the data on inputs 306 is read onto a selected register in the second bank.

Each of the status and control registers 302 are addressed by setting a pointer in the index register 300. The number formed in the index register 300 by writing data to that register in the first bank determines which one of the registers in the status and control register set 302 may be accessed by reading or writing data to the second bank. As shown in the exemplary mapping table of FIG. 4, when the number 0 is loaded into index register 300, the register D0 is available for access in the second bank. Similarly, when the number 1 is loaded into the index register 300, the register D1 is available for access in the second bank. The remaining bits correspond to the remaining data registers in the same fashion. Within the second bank of registers 302 some of the registers are for specifying the configuration of signal path multiplexers within the apparatus, some of the registers are for specifying the attenuation level of attenuation circuits within the apparatus, and some of the registers are for assimilation of status data concerning the state of the operation of the apparatus.

Twenty-four attenuation control registers are listed within the mapping table of FIG. 4, one register for each of the attenuation circuits within the analog controller 10. Data values written onto the selected attenuation control register specifies a signal attenuation level. For example, an attenuation data register value of 00h (00000000) gives no attenuation to the corresponding input signal, a value of 01h (00000001) gives attenuation of $-\frac{1}{4}$ dB, and a value of FFh (11111111) completely turns the input off.

Also listed within the exemplary mapping table of FIG. 4 are two configuration registers which specify the frequency response of the switched capacitor filters 190, 192,194 and 196. Data values written onto the selected register sets the cutoff frequency of the seventh order low pass filter network. As is known in the art, the cutoff frequency of a switched capacitor filter is determined by the frequency of a clocking signal, known as the filter clock, applied to the filter. The cutoff frequency is a sub-multiple of the filter clock frequency. This filter clock is derived from the clock input 318 applied to the multimedia controller 10. The clock input 318 is divided down by the divider circuits 270 and 272 using some divisor specified in the filter clock configuration registers. According to table FIG. 4, register D64 specifies the cutoff frequency of the filters 190 and 192 while the register D65 specifies the cutoff frequency of the filters 194 and 196. A numerically low data value written onto the configuration register establishes a small clock divisor and therefore a high cutoff frequency filter characteristic. A numerically high data value written onto the configuration register establishes a large clock divisor and therefore a low cutoff frequency filter characteristic. A data value of zero will result in a disabling of the filter clock which results in no signal being allowed to pass through the corresponding switched capacitor filter.

Also listed within the table of FIG. 4 are three registers which specify the state or operation of multiplexers 210, 212 and 214. Depending on the data value written onto the selected register, the corresponding multiplexer will pass through the first, second or third input to the multiplexer. A 00h (00000000) data value applied to the multiplexer configuration register selects the first input into the corresponding multiplexer; a 01h (00000001) data value selects the second input, and a 02h (00000010) data value selects the third input.

Also indicated within the table FIG. 4 are registers which determine the configuration and status of the caller ID telephonic function circuit 220, and of the DTMF receiver telephonic function circuit 222. Both the caller ID function 220 and the DTMF receiver function 222 are capable of being configured to issue an interrupt signal which is ultimately passed to the interrupt output signal 320. The configuration registers are essential to establish the conditions under which an interrupt signal will be issued by the corresponding telephonic function 220 or 222.

On power up, all attenuation registers and configuration registers assume a predetermined initialization value. For example, index register 300 assumes a data value of 00h (00000000), thus pointing to the first register in the second register bank 302. It will be appreciated that other registers will have particular initial condition configurations appropriate to their control functions and the uses to which the apparatus will be applied. In an anticipated embodiment of the present invention, the attenuator circuits in all the signal paths are configured to provide full attenuation following a power-up condition.

Since it is anticipated that the multimedia controller apparatus of the present invention be provided on a single integrated circuit, the apparatus further includes connections for electrical power and electrical ground. Inputs 324 provide power to the analog elements of the apparatus, while inputs 322 provide electrical ground to the same analog elements. Inputs 328 provide power to the digital elements of the apparatus, while inputs 326 provide electrical ground to the same digital elements.

Referring now to FIG. 5, an alternative embodiment of the present invention is shown. Typically, the summing circuits described above as 120, 122,124,126, 128,130, 132 and 134 utilize analog current summing junctions to sum the signals together in the analog domain. The analog signals sum together, forming a single analog output. As an alternative to an analog summing circuit, FIG. 5 shows an attenuating and summing circuit in which the analog signals are first digitized, and then summed in the digital domain. The circuit of FIG. 5 would replace the summing circuits 120, 122, and 124 and any associated input attenuator circuits of FIG. 2.

The alternative digital summing circuit of FIG. 5 comprises an analog multiplexer 412, an operational amplifier 416, an analog-to-digital converter (ADC) 420, a multiplier/accumulator 424, an output register 426, a digital-to-analog converter (DAC) 428, and a control circuit 440. The various analog signals 400 first enter the analog multiplexer 412. The analog signals 400 would correspond to either the left channel signals or the right channel signals described above. The analog multiplexer 412 provides a gate in which only one of the analog signals 400 can pass.

The timing and operation of multiplexer 412 is controlled by the control circuit 440. The control circuit 440 clocks the multiplexer 412 at a very high rate, allowing each of the analog signals 400 in a progression to pass through the multiplexer 412 sequentially for a discrete duration of time. The multiplexer output signal 414 then passes through the operational amplifier 416 to increase the signal amplitude to a desired minimum level. The amplified signal 418 then passes through the analog-to-digital converter (ADC) 420, which converts the analog signal to a digital or binary form. The digitized signal 422 is then entered into the multiplier/accumulator 424. As the next one of the analog input signals 400 flows through the ADC 420, its digitized signal, and the digitized sum, passes to the register 426.

In addition, the multiplier/accumulator 424 multiplies the digitized value by a multiplier stored in an associated attenuation data register 200, as described above, to control the attenuation of the signal. The control circuit 440 continues to allow each successive analog input signal to be digitized and summed until a complete set of input signals for a discrete period is digitized and summed, and a temporary sum figure stored at the register 426.

After the temporary sum figure is received and stored by the register 426, the digitized total is passed through the digital-to-analog converter (DAC) 428. The DAC output 430 represents the summed form of analog inputs 400. The control circuit 440 then continuously repeats the process, forming an analog output stream equivalent to the outputs 142, 152 and 144 of FIG. 2. In the preferred embodiment, the clocking rate of control circuit 440 is extremely fast in relation to the frequencies of the analog input signals. Thus, there will be no relative loss of analog information as multiplexer 412 switches between analog inputs 400.

Figure 6:
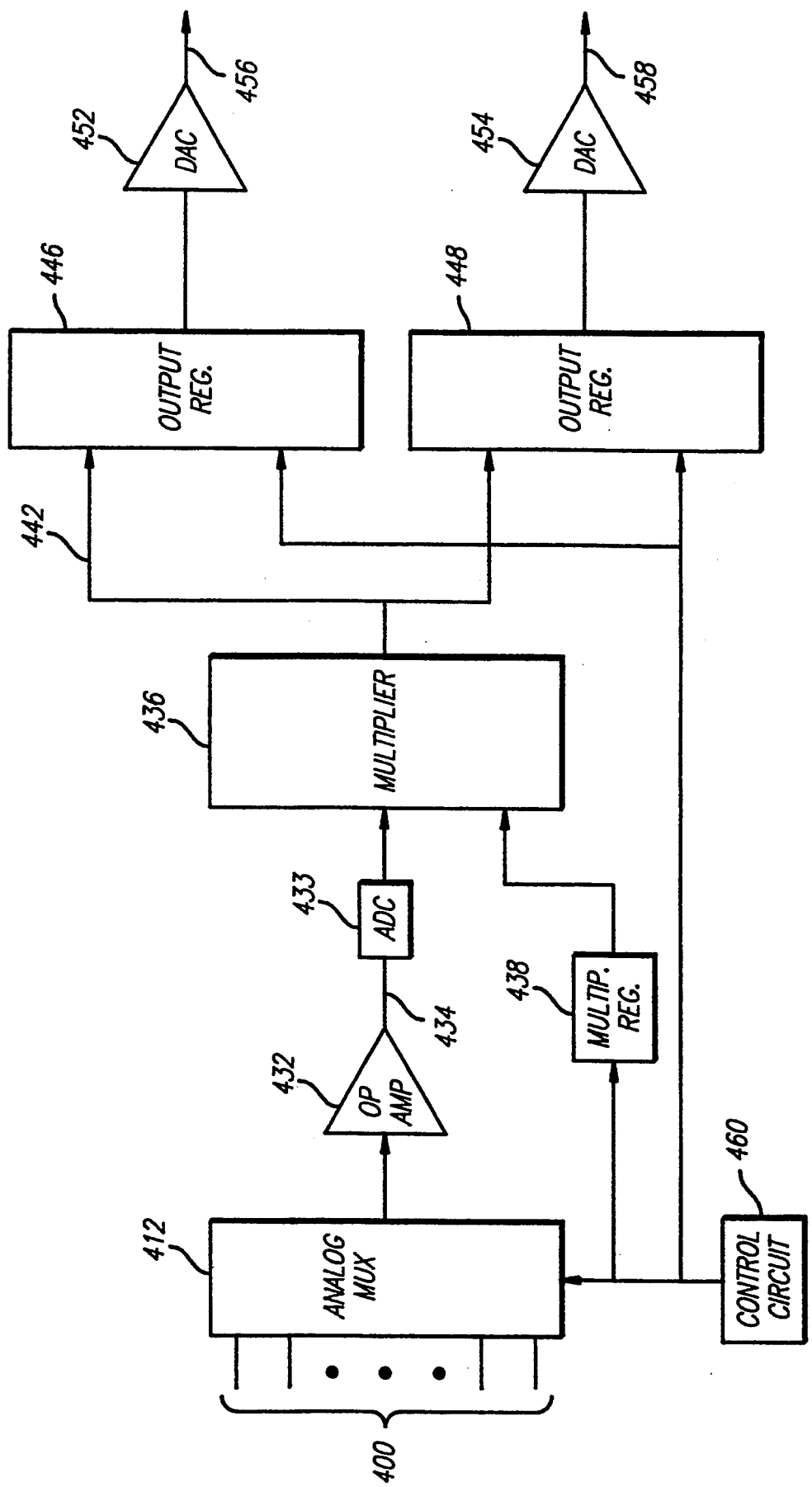
FIG. 6 shows a block diagram of a second alternative embodiment of an audio summing circuit.

Referring now to FIG. 6, there is shown a second alternative embodiment of the present invention. As before, the second alternative embodiment replaces summing circuits 120, 122 and 124 and their associated input attenuation circuits. The second embodiment eliminates the need for mathematical accumulator 424 described above in the first alternative embodiment, by instead relying on the principle of natural audio summing performed by a human ear.

The second alternative summing circuit comprises an analog multiplexer 412, an analog-to-digital converter (ADC) 433, an operational amplifier (OP Amp.) 432, a multiplier 436, a multiplier register 438, output registers 446 and 448, digital-to-analog converters (DAC) 452 and 454, and a control circuit 460. The plurality of analog inputs 400 enter the analog multiplexer 412 as described above. As before, the control circuit 460 provides a high speed clock signal to clock the multiplexer 412, which enables each of the input signals 400 to pass through the multiplexer 412 in sequence while keeping the other circuit elements in synch. The multiplexed input signal 414 is then passed through the OP Amp 432 and digitized by the analog-to-digital converter (ADC) 433. A digitized output 434 then enters the multiplier 436, which mathematically multiplies the output 434 by a number stored in the multiplier register 438. The number in register 438 corresponds with the attenuation value stored in the associated status and control registers 302, described above. Thus, multiplier 436 performs the attenuation step to digitized output 434 without requiring analog attenuators.

An important aspect of the present invention is that the digitized input signals are not actually summed. The inventors of the present invention have discovered a unique and heretofore unrealized phenomenon, which eliminates the need for summing. Since there are N inputs, the human ear would hear the component of each input in the output signals 456 and 458 for 1/N time. Due to the high clock rate, the time period that the listener hears each individual input signal component is extremely small. The inventors of the present invention have discovered that the human ear hears the resulting output as if it were a summed signal. Thus, the present invention as shown in FIG. 6 eliminates the need for a summing circuit and produces a signal which sounds as if it were summed even though it is not.

Next, the attenuated digital output 442 is provided to the registers 446 and 448. The registers each provide temporary storage of the multiplier output value for two complete clock cycles, allowing every other one of input signals 400 to be received by each respective register. The registers are alternatingly enabled by clock pulses from control circuit 460, such that register 446 has a left channel digitized signal and register 448 has a right channel digitized signal. After passing registers 446 and 448, the output signal is converted back to analog form by digital-to-analog converters (DAC) 452 and 454, producing pre-buffered analog output signals 456 and 458. The exemplary output signals 456 and 458 would correspond with the left channel output signal 260 and right channel output signal 262 of FIG 2.

Having thus described a preferred exemplary embodiment of a multimedia analog controller, it should now be apparent to those skilled in the art that the aforestated objects and advantages for the within system have been achieved. It should also be appreciated by those skilled in the art that various modifications, adaptations and alternative embodiments thereof may be made within the scope and spirit of the present invention. For example, audio inputs signals from sources other than those described above could be received, attenuated and summed. A greater number of output signals could also be produced from variations of the input signals. The present invention is defined by the following claims.

We claim:

1. A multimedia controller apparatus comprising:
   a digital circuit means for digitally volume controlling a plurality of analog input signals; including
   a left channel digital circuit receiving left channel input signals and producing a left channel combined signal;
   a right channel digital circuit receiving right channel input signals and producing a right channel combined signal; and
   a mono digital circuit receiving mono input signals and producing a mono combined signal;
   wherein each of said left channel digital circuit, said right channel digital circuit and said mono digital circuit comprise:
   a time multiplexed gate to sequentially permit passage of time sequenced discrete segments of each of said input signals that are produced by sampling said input signals at a rate which is sufficiently high that a human ear perceives said discrete segments as being mixed together and constituting a single analog signal;
   an analog-to-digital converter to convert said discrete segments to a sequence of time sequenced binary outputs;
   a multiplier/accumulator to multiply each of said binary outputs by a number corresponding with a desired degree of attenuation to produce time sequenced multiplied binary outputs;
   a digital-to-analog converter to convert said multiplied binary outputs to time sequenced analog outputs; and
   a control circuit maintaining synchronization of said gate, said analog-to-digital converter, said multiplier/accumulator and said digital-to-analog converter;
   output means for producing stereo, mono, waveform samplable, and telephony outputs from said digitally volume controlled signals; including
   a left channel output circuit receiving said left channel combined signal and producing a left channel output signal, a right channel output circuit receiving said right channel combined signal and producing a right channel output signal, and a mono channel output circuit receiving said mono combined signal and producing a mono output signal; and
   data control means for controlling said digital means and said output means; including
   a plurality of configuration data registers, one of each of said configuration data registers corresponding to said left channel output circuit, said right channel output circuit, and said mono output circuit, said configuration data registers further controlling said output circuits to provide a selectable output format; and an index register receiving a plurality of externally generated data inputs and providing said data inputs to said configuration data registers and said multiplier/accumulator.

2. A multimedia controller apparatus comprising:

a digital circuit means for digitally volume controlling a plurality of analog input signals;

output means for producing stereo, mono, waveform samplable, and telephony outputs from said digitally volume controlled signals; and data control means for controlling said digital means and said output means;

the digital circuit means including:

a time multiplexed gate to sequentially permit passage of discrete segments of each of said input signals that are produced by sampling said input signals at a rate which is sufficiently high that a human ear perceives said discrete segments as being mixed together add constituting a single analog signal;

an analog-to-digital converter to convert said discrete segments to a sequence of binary outputs;

a multiplexer to multiply each of said binary outputs by a number corresponding with a desired degree of attenuation to produce time sequenced multiplied binary outputs;

a left channel output register and a right channel output register to alternatingly receive and temporarily store said multiplied binary outputs;

a left channel digital-to-analog converter to convert said stored left channel multiplied binary output to a left channel analog signal;

a right channel digital-to-analog converter to convert said stored right channel multiplied binary output to a right channel analog signal; and a synchronizing means for maintaining synchronization of said gate, said analog-to-digital converter, said multiplier, said registers, and said digital-to-analog converters.

3. The multimedia controller apparatus of claim 2, wherein said output means further comprises:

a left channel output circuit receiving said left channel analog signal and producing a left channel output signal, and a right channel output circuit receiving said right channel analog signal and producing a right channel output signal.

4. The multimedia controller apparatus of claim 3, wherein said data control means further comprises:

a plurality of configuration data registers, one of each of said configuration data registers corresponding to said left channel output circuit, said right channel output circuit, said configuration data registers further cooperating with said output circuits to provide a selective output format.

5. The multimedia controller apparatus of claim 4, wherein said data control means further comprises:

a register index receiving a plurality of externally generated data inputs and providing said data inputs to said configuration data registers and said multiplier.

* * * * *